United States Patent
Standing et al.

(10) Patent No.: US 9,653,322 B2
(45) Date of Patent: May 16, 2017

(54) METHOD FOR FABRICATING A SEMICONDUCTOR PACKAGE

(71) Applicant: Infineon Technologies Austria AG, Villach (AT)

(72) Inventors: Martin Standing, Villach (AT); Andrew Roberts, Wrexham (GB)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/311,431

(22) Filed: Jun. 23, 2014

(65) Prior Publication Data

US 2015/0371935 A1    Dec. 24, 2015

(51) Int. Cl.
*H01L 21/00* (2006.01)
*H01L 21/48* (2006.01)
*H01L 23/538* (2006.01)
*H01L 23/00* (2006.01)
*H05K 1/18* (2006.01)

(52) U.S. Cl.
CPC ...... *H01L 21/4857* (2013.01); *H01L 23/5384* (2013.01); *H01L 23/5389* (2013.01); *H01L 24/24* (2013.01); *H01L 24/82* (2013.01); *H05K 1/186* (2013.01); *H01L 24/97* (2013.01); *H01L 2224/24011* (2013.01); *H01L 2224/24101* (2013.01); *H01L 2224/24227* (2013.01); *H01L 2224/82031* (2013.01); *H01L 2224/82101* (2013.01); *H01L 2224/97* (2013.01); *H01L 2924/01029* (2013.01); *H05K 1/184* (2013.01); *H05K 2201/10166* (2013.01)

(58) Field of Classification Search
USPC ......................................................... 438/125
See application file for complete search history.

(56) References Cited

U.S. PATENT DOCUMENTS

| | | | | |
|---|---|---|---|---|
| 8,116,066 | B2 * | 2/2012 | Inoue .................. | H01L 23/5389 361/321.4 |
| 8,441,804 | B2 * | 5/2013 | Haeberlen ............ | H01L 21/561 361/760 |
| 8,704,365 | B2 * | 4/2014 | Park .................... | H01L 23/3128 257/724 |
| 8,803,310 | B1 * | 8/2014 | Chuo ................... | H01L 23/552 174/252 |
| 8,810,024 | B2 * | 8/2014 | Lin ........................ | H01L 23/13 257/621 |
| 2005/0130349 | A1 * | 6/2005 | Sunohara ............. | H01L 21/563 438/108 |
| 2007/0087512 | A1 * | 4/2007 | Cho ...................... | H01L 23/642 438/381 |
| 2007/0108585 | A1 * | 5/2007 | Pavier ................. | H01L 23/3128 257/690 |
| 2009/0042337 | A1 * | 2/2009 | Landau .................. | H01L 24/97 438/109 |
| 2009/0160046 | A1 * | 6/2009 | Otremba ............. | H01L 23/5389 257/700 |

(Continued)

*Primary Examiner* — Caleb Henry
(74) *Attorney, Agent, or Firm* — Shumaker & Sieffert, P.A.

(57) ABSTRACT

Representative implementations of devices and techniques provide a semiconductor package comprising a laminate substrate. The laminate substrate includes at least one conductive layer laminated to a surface of an insulating core. The laminate substrate also includes one or more die openings, in which one or more semiconductor die are located.

17 Claims, 8 Drawing Sheets

(56) References Cited

U.S. PATENT DOCUMENTS

| | | | |
|---|---|---|---|
| 2009/0215231 A1* | 8/2009 | Inoue | H01L 23/5389 438/125 |
| 2013/0069243 A1* | 3/2013 | Otremba | H01L 23/492 257/774 |
| 2013/0249115 A1* | 9/2013 | Lin | H01L 23/13 257/777 |

* cited by examiner (a)

(b)

(a)

(b)

METHOD FOR FABRICATING A SEMICONDUCTOR PACKAGE

BACKGROUND

Semiconductor devices are used in many electronic and other applications. Semiconductor devices include integrated circuits (IC) or discrete devices that are formed on semiconductor wafers by depositing many types of thin films of material over the semiconductor wafers. Semiconductor devices are packaged using various packaging technologies, including over-molded through hole or surface mount devices or ball grid array (BGA), Plastic Ball Grid Array (PBGA), Flip-chip chip scale package (CSP) (FCBGA), and so forth.

Packaged semiconductor devices may be mounted to carriers, such as printed circuit boards, for use in electronic applications. Conventional printed circuit boards may consist of a core member or layer—generally referred to as PCB core laminate layer—and may include one or more additional layers laminated to the core layer. For example, a PCB may include a plurality of conductive and insulating layers sandwiched together. Openings, referred to as interconnect or through vias, may be drilled or punched through one or more of the sandwiched layers to provide a conductive path between certain traces on different layers.

Typically a printed circuit board (PCB) is populated with components post manufacture and in the case of the semiconductor devices, these are supplied as packaged devices for mounting to the PCB. It is desirable for semiconductor packages to provide performance and leverage efficient manufacturing methods to achieve cost reductions.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
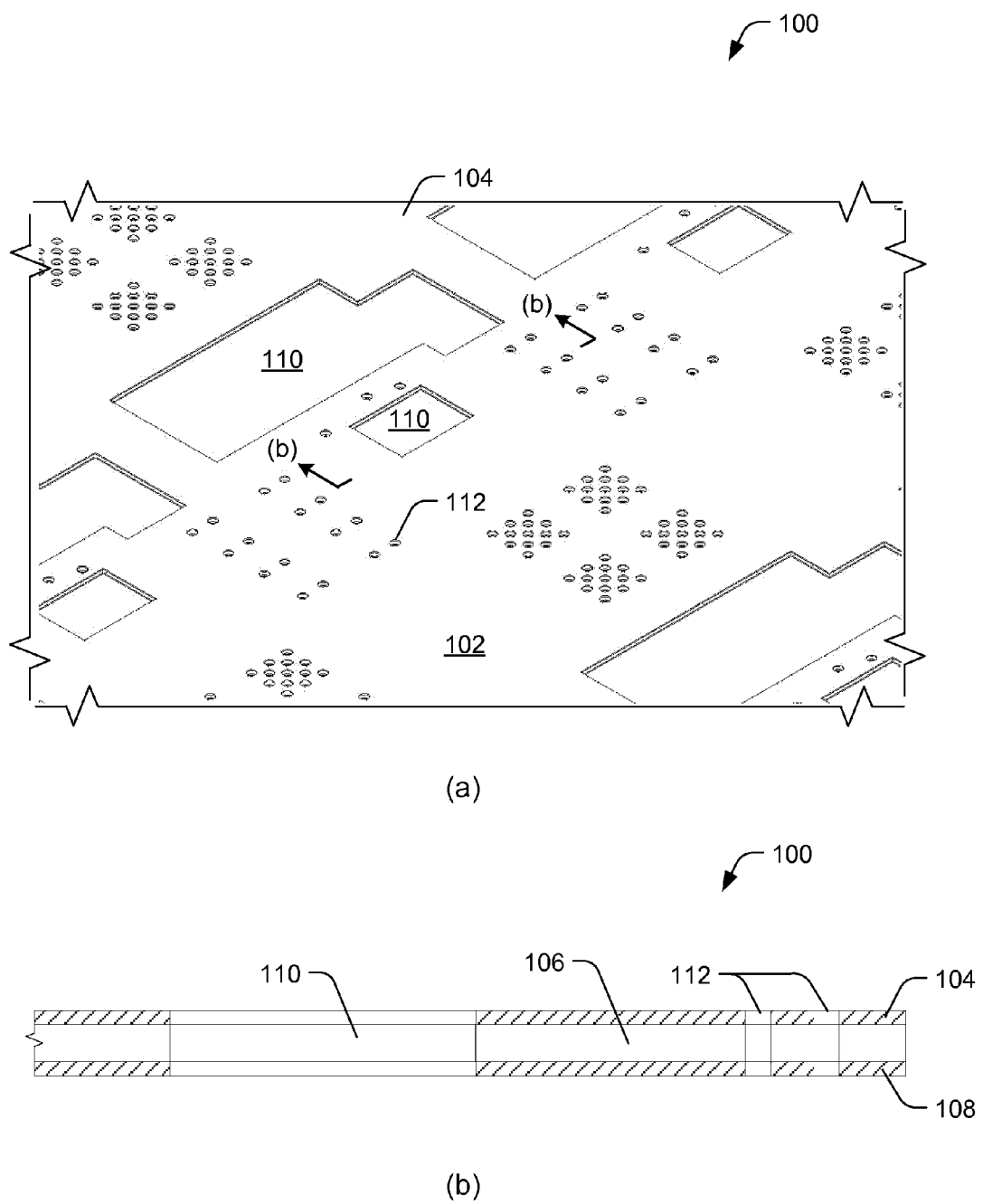
FIG. 1 illustrates an example laminate substrate having one or more apertures, according to an implementation. A top view of the substrate and a magnified cross-sectional view of the substrate are shown at (a) and (b), respectively.

In semiconductor technologies, FoM (Figure of Merit) and circuit efficiency have been continuously improved by scaling from one technology to another while reducing cost per transistor. Connection areas are also scaled during device scaling, which increases power density per given area. Improvements in packaging are desired to prevent parasitic elements from the package overwhelming the improvements made within the semiconductor die. Therefore, connections are made to the semiconductor device that best use the available area of the die. These connections generally terminate in contact areas and pitches that are compatible with conventional electronic assembly methods used by the component user, such as surface mounting technologies.

Conventional semiconductor packaging technologies use solder, conductive glue and other methods of attaching die (chip) to conductors, which can result in relatively high loss connection paths. Even with the best practices, the result of "soldering" can be relatively high impedance intermetallic formations.

The connection methods conventionally used on the front side of the die (chip) can be even worse. Wire-bonding, ribbon-bonding and clip bonding can result in relative small cross-sectional area conduction paths. As the chips get smaller, the problems increase as the physical connection area decreases and methods such as wire-bonding, clip-bonding become difficult to implement. More recently, fabricators have started to utilize semi-embedded and embedded technologies. However, these technologies often use micro-via technologies with limitations on connection cross-sectional dimension and via pitch (distance between adjacent vias), which can result in increasing current densities and thermal conductivities with further scaling.

Representative implementations of devices and techniques disclosed herein provide a semiconductor package comprising a laminate substrate, which increases the contact area and quality of contact to both sides of the semiconductor die within such packages. In an implementation, a semiconductor device, such as an integrated circuit (IC), discrete semiconductor component, or the like (referred to herein as a "die"), may be embedded within an aperture of the laminate substrate to form a package for the die.

In an implementation, the laminate substrate includes at least one conductive layer, such as a copper foil, or the like, laminated to a surface of an insulating core (e.g., fiberglass, etc.). The conductive layer may be etched, or otherwise processed, to form circuit traces. In some examples, the laminate substrate includes first and second conductive layers laminated to each side (front and back, for example)

of the core. In various implementations, the laminate substrate also includes one or more die openings (i.e., apertures) in which one or more semiconductor die are located. For example, one, two, or more die may be disposed within a single die opening. Further, a laminate substrate may include several die openings, each with one or more die located within.

In some aspects, the laminate package may include an insulating retainer disposed around one or more of the die within the die openings. For example, the insulating retainer may be arranged to retain the one or more die within the die openings, as well as separate the die from each other. In some implementations, the insulating retainer may include an insulating layer disposed over the top and/or the bottom surface of the die, partially or fully enclosing the die within the die opening. Holes may be formed in the insulating layer to accommodate connections to die terminals. For example, the insulating retainer and/or insulating layer may be comprised of a photo-imaging polymer dielectric material.

In various implementations, the laminate package includes a partial metallization layer, disposed predominantly over the die, and including a portion of the laminate substrate. In an example, the partial metallization layer forms fine traces that electrically couple the terminals of the one or more die to coarse traces formed by the conductive layer(s) of the laminate substrate. In this way, the conductive paths from the semiconductor die to the extents of the laminate package can be optimized.

Various implementations and techniques for semiconductor die packaging are discussed in this disclosure. Techniques and devices are discussed with reference to example devices, circuits, and systems illustrated in the figures that use chip die, or like components. However, this is not intended to be limiting, and is for ease of discussion and illustrative convenience. The use herein of the term "die" is intended to apply to all of various active or passive components, circuits, systems, and the like, that may be packaged within a laminated substrate.

Various aspects described herein achieve many advantages by utilizing a core laminate having a thickness similar to the die. The core laminate acts as a structural foundation for all subsequent building stages, which are based on sequential build-up technologies. This approach brings numerous advantages throughout the assembly processes. The first of the advantages is that the entire technology uses very inexpensive materials and has very little waste and a low number of processing stages, which results in a simple and inexpensive end product. The sequential build-up method means that the openings to the die may be formed using the photo-imaging dielectric. This allows large area connections to be formed in any shape or form as required by the package and circuit layout. Advantageously, this is achieved without complex processing and technologies.

Implementations are explained in more detail below using a plurality of examples. The specific implementations discussed are merely illustrative of some ways to make and use the package, and do not limit the scope of the disclosure. Although various implementations and examples are discussed here and below, further implementations and examples may also be possible by combining the features and elements of individual implementations and examples.

Example Package Implementation

FIG. 1 illustrates an example laminate substrate 102 which may be used to form a semiconductor die package 100, according to an implementation. A top view of the substrate 102 and a magnified cross-sectional view of the substrate 102 are shown at (a) and (b), respectively. In an implementation, the laminate substrate 102 is formed to include a first conductive layer 104 laminated to a first side of an insulating core layer ("core") 106, and may also include a second conductive layer 108 laminated to a second side of the core 106, in some examples.

The core layer 106 may comprise a glass fiber reinforced epoxy, or the like. Examples of materials that may be used as the core layer 106 include FR4 materials (epoxy phenolic or epoxy novolac materials), bimaleimide (BT) materials, polyimide, cyanate-esters, ceramic, mineral based laminates, glass like amorphous materials. The core layer 106 may be reinforced with glass weaves, papers, fibers or fillers especially when the material of the core layer 106 is an organic material.

Additionally, the first and the second conductive layers (104 and 108) may comprise copper, such as a copper foil for example, or other metallic or otherwise conductive material. In one or more implementations, the first 104 and/or second 108 conductive layers are pre-laminated to the top and bottom surfaces of the core layer 106. In other words, the laminate substrate 102 comprises a copper-clad substrate.

In various implementations, the metal in the first and the second conductive layers (104 and 108) can be pre-treated and roughened before lamination to the core layer 106, which may be organically based. Therefore, the first and the second conductive layers (104 and 108) advantageously have a high peel strength. In contrast, in conventional processing, metal layers with high peel strength are not achievable where metal layers are deposited over non-metallic materials during subsequent processing, (e.g., during formation of redistribution lines).

In various implementations, the thickness of the laminate substrate 102 is about the same as the die to be packaged within it. For example, when a thickness of the die to be placed is about 100 µm, then a thickness of the core layer 106 may be about 80 µm while the first and the second conductive layers (104 and 108) may each be about 10 µm thick, so that the total thickness of the laminate substrate 102 is also about 100 µm. In various implementations, the thickness ratios between the core layer 106 and the first and the second conductive layers (104 and 108) may be varied so as to generate about the same overall thickness. In various implementations, the thickness of the core layer 106 is about 70% to about 90% of the thickness of the die to be packaged. The package 100 thickness, including die, may be about 200 µm to about 300 µm in an alternative implementation.

As shown in FIG. 1, the substrate 102 has one or more apertures (e.g., die openings) 110, for accepting die. In various implementations, the apertures 110 are formed using a variety of technologies (e.g., drilling, routing, punching, chemical machining, laser ablation, laser cutting, plasma etching, water jet cutting, etc.) into the pre-laminated substrate 102. In other words, the substrate 102 includes the first conductive layer 104 (and the second conductive layer 108, if applicable) prior to forming the apertures 110. In various implementations, the apertures 110 may be formed at this stage of processing or subsequently, depending on available process choices.

In various implementations, a die opening 110 is cut to be slightly larger than the die to be placed so that the die fits within the die opening 110 easily, and to allow for some inaccuracy during die placement. For example, the difference in width of the die opening 110 with the width of the die to be placed can be about 50 µm per side, and about 20 µm to about 100 µm per side in various implementations.

This gap may be dependent on several factors such as cutting accuracy, stability of the laminate material and die placement accuracy.

Additionally, in an implementation, the substrate 102 includes one or more interconnect or through vias ("vias") 112 arranged to electrically couple at least a portion of the second conductive layer 108 to a portion of the first conductive layer 104. For example, traces on each layer (104 and 108) may be coupled using one or more vias 112.

Figure 2:
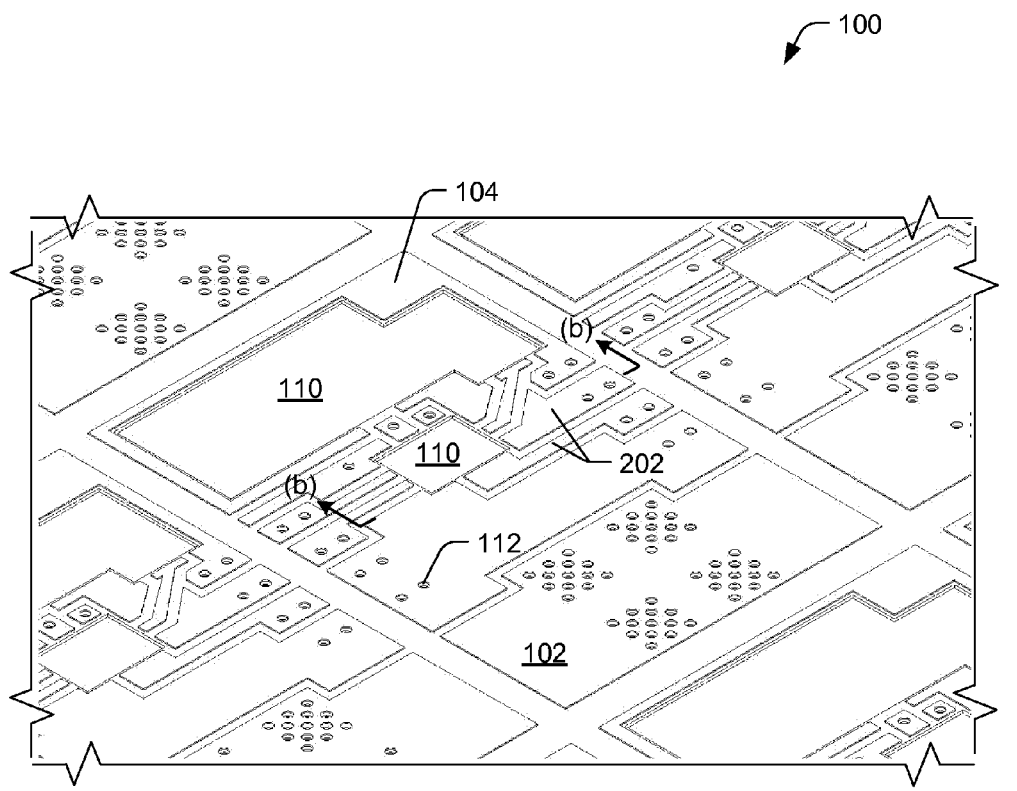
FIG. 2 illustrates an example laminate substrate after a first etch, according to an implementation. A top view of the substrate and a magnified cross-sectional view of the substrate are shown at (a) and (b), respectively.
Figure 2:
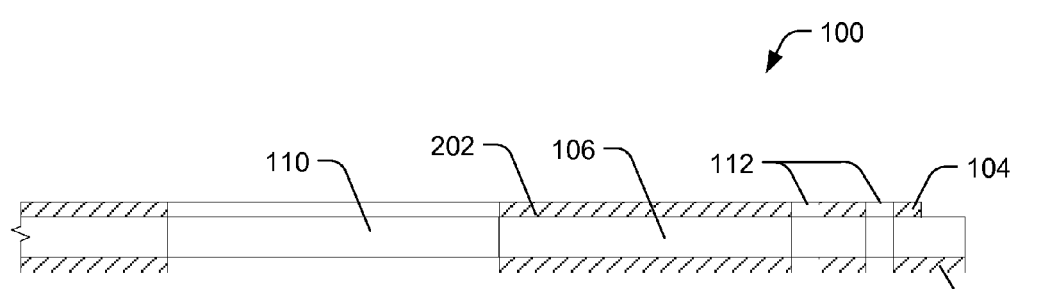

FIG. 2 illustrates an example laminate substrate 102 after removing a portion of the first conductive layer 104 to form a plurality of coarse traces 202 (e.g., traces having a relatively greater width), according to an implementation. A top view of the substrate and a magnified cross-sectional view of the substrate are shown in FIG. 2 at (a) and (b), respectively. For example, the first conductive layer 104 may be etched, to form various course traces 202 for connecting die to package 100 contacts.

In some implementations, a portion of the first and/or the second conductive layers (104 and 108) is removed around the edges of the die openings 110. For example, the conductive material may be removed to avoid metal shorts. In various implementations, the edge portions of the first and the second conductive layers (104 and 108) are removed using a etch process, or the like, to form etch back regions. In some implementations, the order of cutting the laminate substrate 102 and etching the conductive layers (104 and 108) may be exchanged depending on the processes used.

Figure 3:
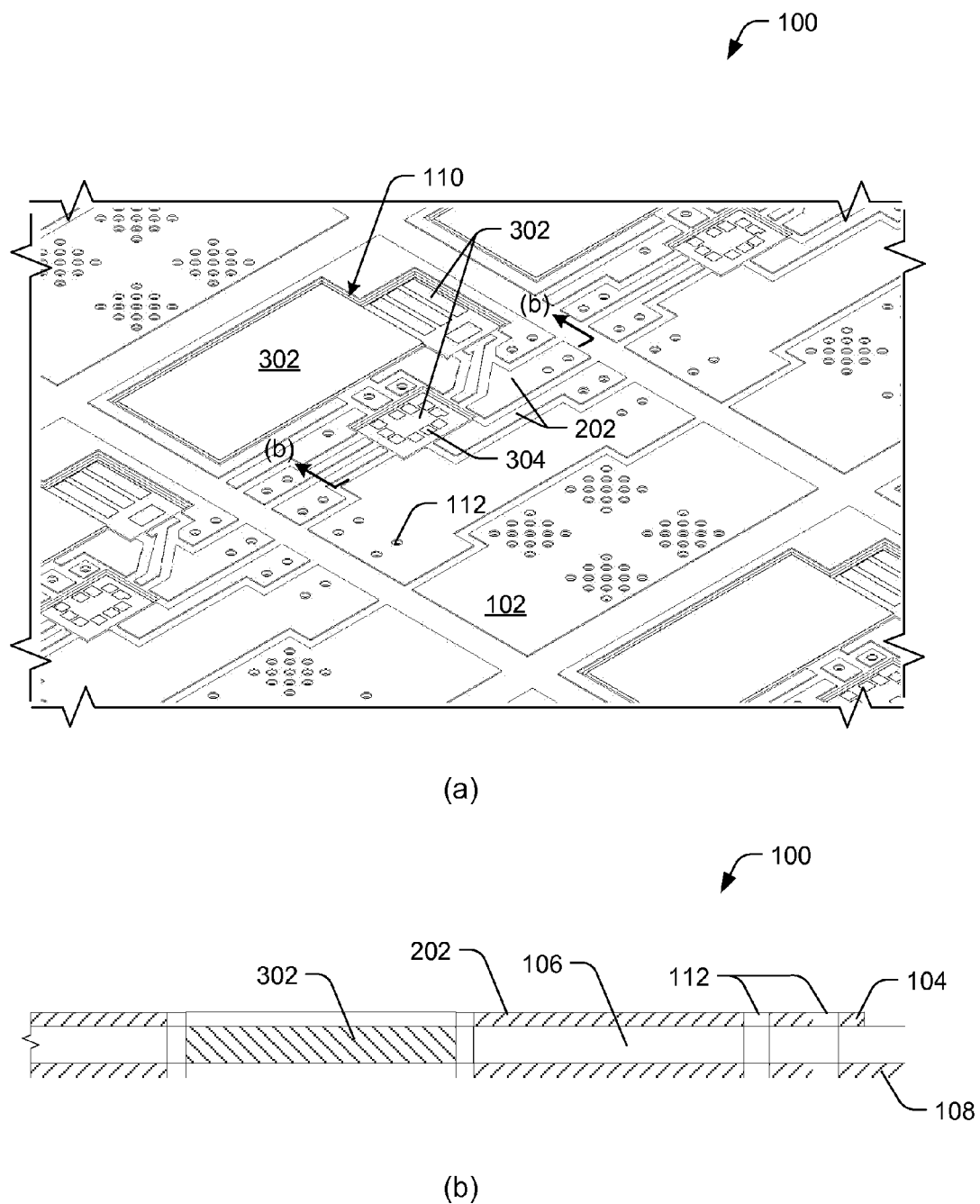
FIG. 3 illustrates an example laminate substrate after die placement, according to an implementation. A top view of the substrate and a magnified cross-sectional view of the substrate are shown at (a) and (b), respectively.

FIG. 3 illustrates an example package 100 after die 302 placement, according to an implementation. A top view of the package 100 and a magnified cross-sectional view of the package 100 are shown in FIG. 3 at (a) and (b), respectively.

In an implementation, the laminate substrate 102 may be mounted on a carrier (not shown) during die 302 placement. For example, the carrier may comprise a rigid carrier or may comprise a tape, or the like. In some examples, a top layer of the carrier may include an adhesive layer for holding the laminate substrate 102 during processing.

In various implementations, the die 302 are placed into the die openings 110. In alternate implementations, the die 302 may be placed either way upwards. For example, in the case of conventional vertical field effect transistor (FET) devices, the gate and source may be facing either up or down. The configuration of the die 302 within the package 100 is dependent on the circuit configuration, and preferred layout.

In an implementation, as shown in FIG. 3, more than one die 302 may be placed within a die opening 110. For example, two die 302 are shown placed adjacent to each other in the die opening 110 indicated in FIG. 3 at (a). In an implementation, there may be a gap or space (not shown) between the multiple die 302 located within a same die opening 110. In one example, at least a portion of the second conductive layer 108 electrically couples at least one terminal of a first die 302 located within one of the die openings 110 to at least one terminal of a second die 302 located within the same die opening 110.

Figure 4:
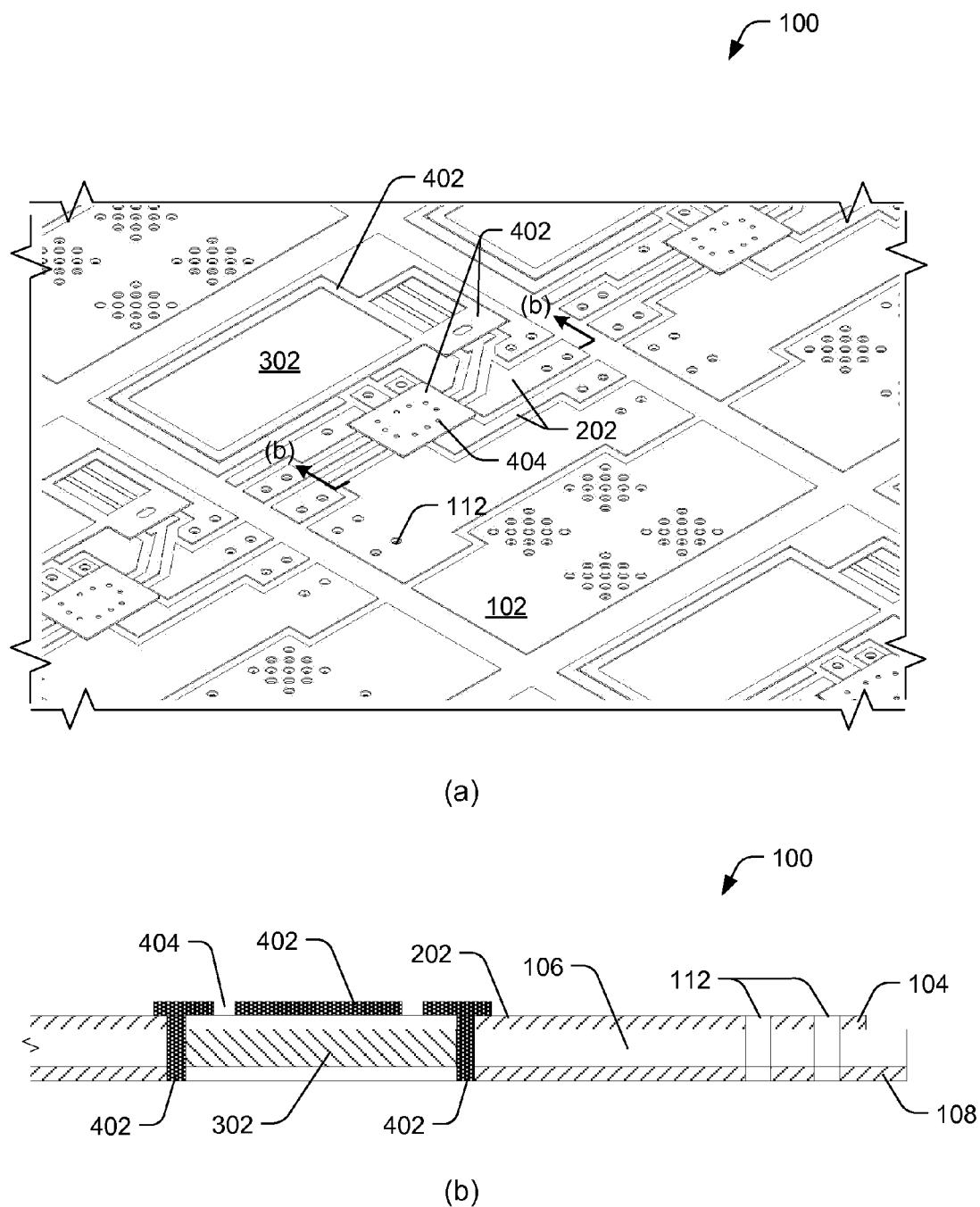
FIG. 4 illustrates an example laminate substrate with dielectric application, according to an implementation. A top view of the substrate and a magnified cross-sectional view of the substrate are shown at (a) and (b), respectively.

FIG. 4 illustrates an example package 100 with dielectric applied, according to an implementation. A top view of the package 100 and a magnified cross-sectional view of the package 100 are shown in FIG. 4 at (a) and (b), respectively. After placing the die 302 within the die openings 110, an insulating retainer 402 (i.e., insulating or dielectric layer) is deposited around the one or more die 302 within one or more of the die openings 110. In an implementation, the insulating retainer 402 is arranged to retain the one or more die 302 within the one or more of the die openings 110. For example, the insulating retainer 402 is formed along the perimeter of the die 302. In an implementation, the insulating retainer 402 is disposed between multiple die 302 located within a single die opening 110, separating the multiple die 302.

In an implementation, the insulating retainer 402 also extends over the top surface of one or more of the die 302. For example, the insulating retainer 402 is disposed over a top surface and/or a bottom surface of the one or more die 302, at least partly coating the top surface and/or the bottom surface of the one or more die 302. In one example, the insulating retainer 402 fully coats the bottom surface of one or more die 302.

In another example, an opening 404 is formed in the insulating material 402 (top and/or bottom surfaces of the package 100) for connection to a terminal of the die 302. In the example, the opening 404 may be formed as the insulating layer 402 is formed, or the opening 404 may be formed by removing some of the insulating material (via photo-imaging, lithography, etc.) after the insulating layer 402 is formed. For instance, in one implementation, the entire top surface of a die 302 is coated with insulating material, excluding one or more apertures 404 to provide access to terminals of the die 302.

The insulating retainer 402 is disposed in a gap between the die 302 and the laminate substrate 102. For example, the insulating retainer is formed in a space between an inner edge of the one or more die openings 110 and an outer edge of the one or more die 302 located within the one or more die openings 110. In various implementations, the insulating retainer 402 is also disposed over a portion of the die 302 thereby mechanically holding or securing the die 302. For example, the insulating retainer 402 may have a cross-sectional shape of an "I" or a rotated "H." Other shapes that cover the top surface and the bottom surface of the die 302 may be used in various implementations. The insulating retainer 402 advantageously holds the die 302 within the laminate substrate 102 during processing and subsequently during the product life time.

For example, the insulating retainer 402 holds the die 302 in place when the laminate substrate 102 is inverted. The insulating retainer 402 also protects the edge of the die 302 and may also act as a dielectric for the patterning of the contacts to the die 302. The insulating retainer 402 may also be used directly to form the dielectric layer to pattern die 302 contacts. The insulating retainer 402 may also be used to complement existing dielectric layers already deposited at the die 302 level. Alternatively, an additional dielectric layer may be printed over the insulating retainer 402 to pattern the die 302 contacts.

Thus, the dielectric material deposition of the insulating retainer 402 can effectively fulfill multiple tasks: die 302 edge isolation; separation of terminals and pads; dielectric coating of surfaces; retention of die 302 within an aperture 110 by the creation of a formed section; a surface that can be metalized to produce tracks, as well as other tasks.

The insulating retainer 402 may be formed or deposited in several ways in various implementations, including using screen printing, flood coating, curtain coating, spray deposition etc. The material of the insulating retainer 402 may be a photo-imaging or photo-patterning material in one implementation, for ease of processing and improving patterning accuracy. In another implementation, a pattern screen printing process is used along with photo-imaging to precisely pattern the material.

In various implementations, the insulating retainer 402 may be created in at least two steps and deposited from both top and bottom surfaces. In one case, the insulating retainer 402 could be deposited (around a perimeter of each of a plurality of die 302, for example) as a patterned structure using a mesh screening process with a stencil (sometimes referred to as silk-screening). Alternatively, in one implementation, the insulating retainer 402 may be deposited using metal stencil printing. Further, the material of the insulating retainer 402 may be processed with a lithographic process (photo-imaging) and excess material would then be developed away, leaving the form of the insulating retainer 402. In some implementations, a thermal process is performed after depositing the material of the insulating retainer 402. The thermal process cures the insulating material to form the insulating retainer 402.

Figure 5:
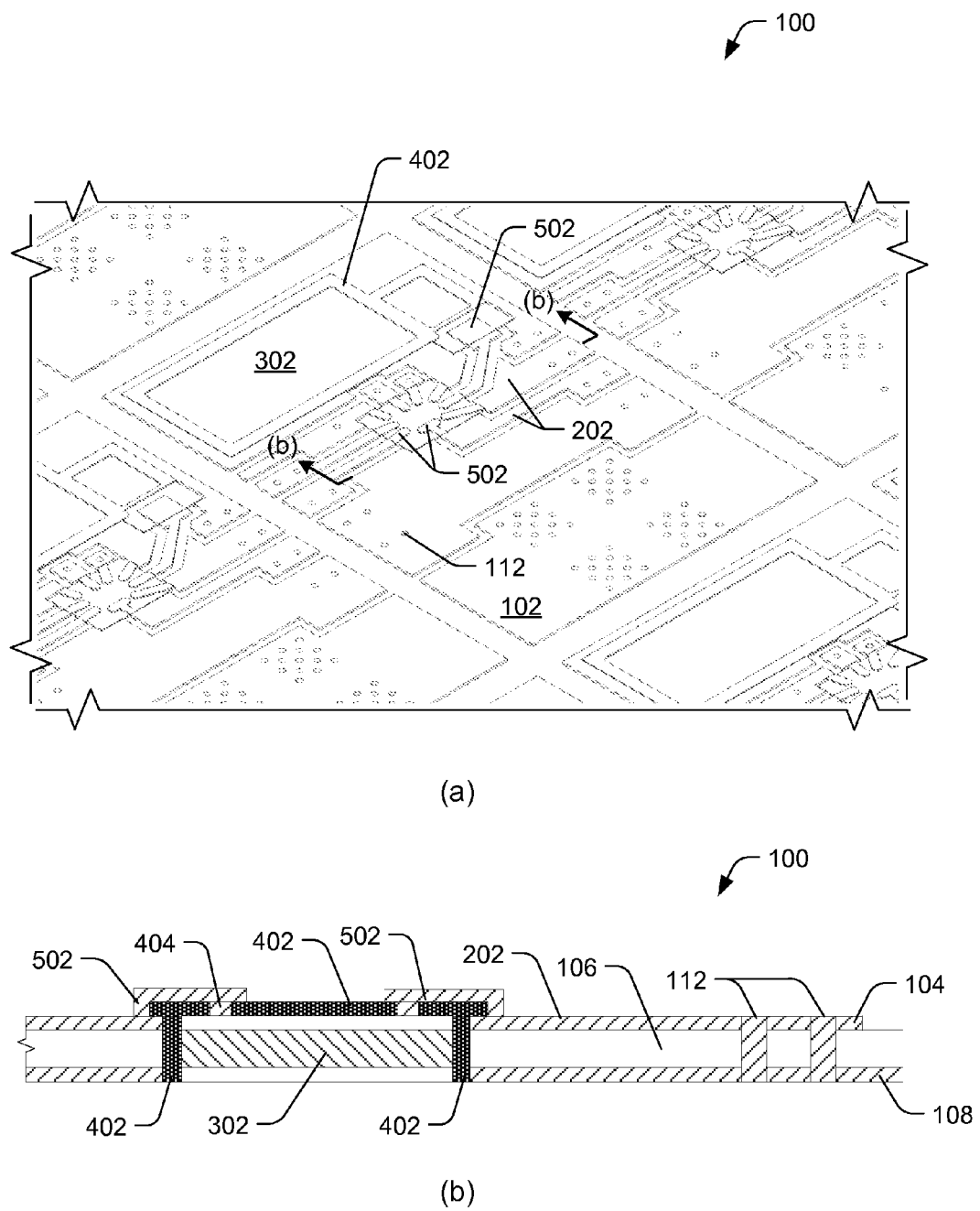
FIG. 5 illustrates an example laminate substrate with pattern plating, according to an implementation. A top view of the substrate and a magnified cross-sectional view of the substrate are shown at (a) and (b), respectively.

FIG. 5 illustrates an example package 100 with pattern plating, according to an implementation. A top view of the package 100 and a magnified cross-sectional view of the package 100 are shown in FIG. 5 at (a) and (b), respectively.

In an implementation, an area above one or more die 302 and a portion of the laminate substrate 402 surrounding the one or more die 302 are at least partially metallized to electrically couple the die 302 to the first conductive layer 104. In the implementation, a partial metallization layer 502 is formed in an area above the one or more die 302, (in contrast to forming a metallization layer over a larger area or the entire area) of the laminate substrate 102. In an implementation, the partial metallization layer 502 includes pattern plating formed over the insulating layer (e.g., insulating retainer) 402 above the die 302 and in the immediate adjacent areas. In one example, a portion of the insulating layer (i.e., insulating retainer 402) may be removed from an area of one or more of the semiconductor chip die 302 to allow for terminal connections using the fine traces of the partial metallization layer 502.

In an implementation, conductive traces having a mix of coarse geometry and fine geometry are formed on the package 100. For example, concentrating the partial metallization to an area predominantly above the die 302 can economically and efficiently form fine geometry traces 502 (through pattern plating, for example) to couple terminals of the die 302 to coarse geometry traces 202 formed from the first conductive layer 104 (by removing a portion of the first conductive layer 102 through etching, for example).

In various examples, the ratio of the width of the fine traces 502 (e.g., pattern plating) to the width of the coarse traces 202 formed from the first conductive layer is about 15:1 to about 30:1. For example, connections to a high density die 302 call for fine track width and sufficient gaps, which can be achieved with very fine traces. These fine traces can have limitations regarding parasitic losses when carrying a signal over a large distance. The majority of the trace (outside of the die 302 area) can be created in a relatively wide metal formed from the first conductive layer 104.

In one example, a die 302 as shown in FIG. 5 is an IC driver. In the example, the metallization traces 502 are 20 μm wide. The tracks 502 are joined to tracks 202 that are created from the first conductive layer 104, that also start at a width of 20 μm and become 40 μm wide toward the extents of the package 100. In another example, the fine traces 502 are 5-10 μm wide, allowing very aggressive track and gap ratios. The tracks 202 that the traces 502 connect to are 40 μm wide, and therefore have a lower loss.

Traces formed of the partial metallization layer 502 may be patterned and formed to couple terminals of adjacent die 302 in the same or different die openings 110. In one implementation, at least a portion of the partial metallization layer 502 electrically couples at least one terminal of a first die 302 located within a single die opening 110 to at least one terminal of a second die 302 located within the same die opening 110.

In another implementation, the through vias 112 are also plated to electrically couple at least a portion of the second conductive layer 108 at the bottom side of the package 100 to one or more nodes of the first conductive layer 104 at the top side (e.g., first side) of the insulating core layer 106. Additionally, the openings 404 in the insulating retainer 402 are plated or filled to electrically couple the terminals of the die 302 to the traces 502. In an example, the vias 112 and/or the openings 404 are plated using the same process (and at the same time) as the formation of the fine traces 502, during pattern plating.

In various implementations, a patterned resist layer (not shown) representing a circuit layout for the package 100 may be used to form the partial metallization layer 502, including the fine traces and/or the fill for the vias 112. In the implementations, the patterning may be accomplished using conventional lithography processes, etching, and the like. Alternatively, in another implementation, a laser ablation process may be used for structuring the patterned plating of the partial metallization 502, especially when patterning the thin metal layers.

Figure 6:
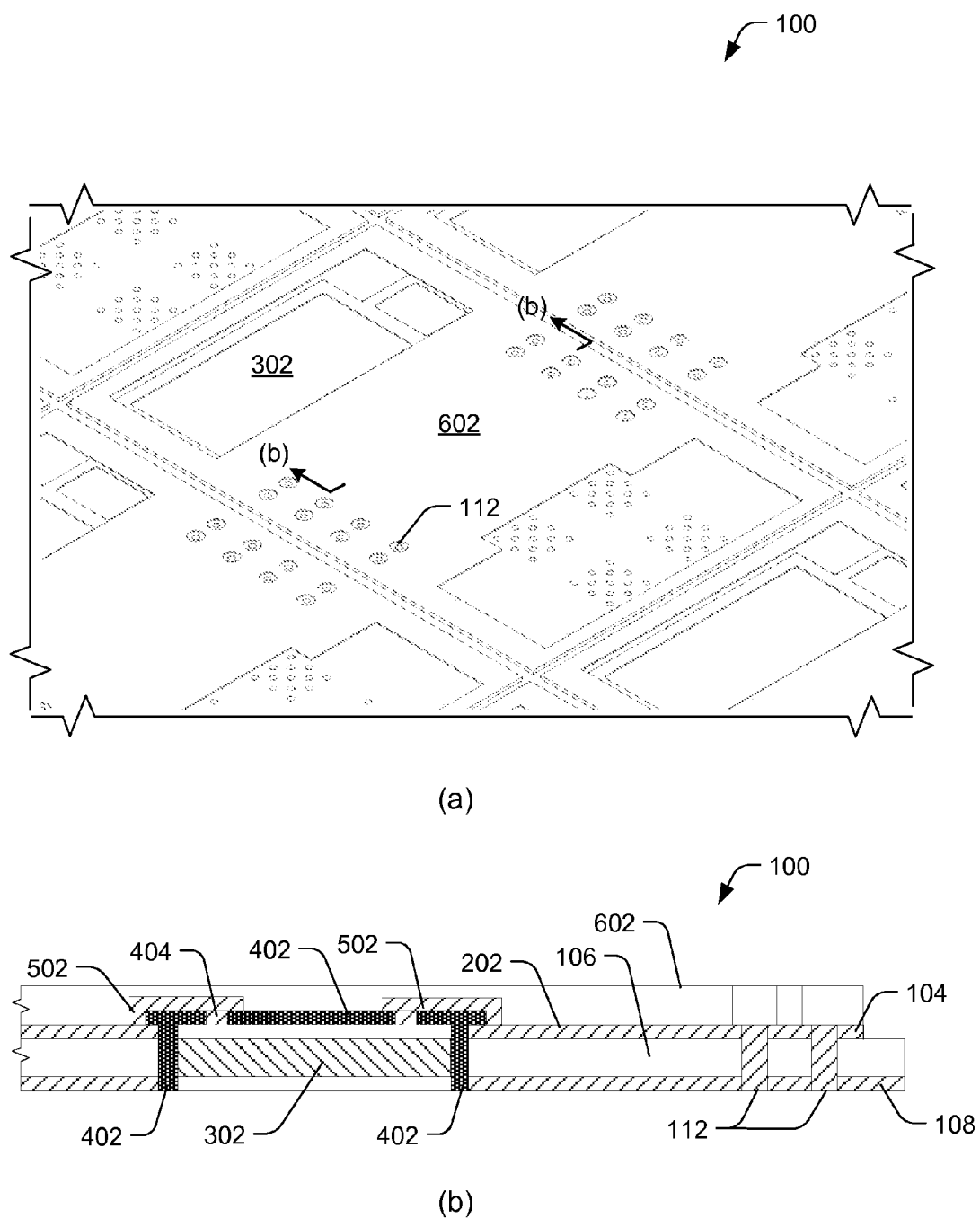
FIG. 6 illustrates an example laminate substrate with solder-mask, according to an implementation. A top view of the substrate and a magnified cross-sectional view of the substrate are shown at (a) and (b), respectively.

FIG. 6 illustrates an example package 100 with solder-mask 602 applied, according to an implementation. A top view of the package 100 and a magnified cross-sectional view of the package 100 are shown in FIG. 6 at (a) and (b), respectively.

In an implementation, a solder mask 602 is formed to cover one or more portions of the semiconductor package 100, as shown in FIG. 6. In the implementation, a solder mask 602 (e.g., a dielectric layer) may be formed over (and sometimes under also) the laminate substrate 102. The solder mask 602 may be used to further define the circuit connectivity or to protect one or more nodes of the package 100 circuit with different potentials.

The dielectric layer may be an organic material in one implementation. The solder mask 602 may be fabricated from a polymer, such as poly (p-xylylene) (parylene), photo resist material, imide, epoxy, epoxy resin, duroplast, silicone, or ceramics such as materials comprising carbon and silicone, or the like. In various implementations, the solder mask 602 may be deposited as a liquid or paste using screen printing, curtain coating, flood coating, spraying, etc. or by using a dry-film laminate or sheet. The solder mask 602 may be deposited from a gas phase or from a solution, or can be printed or laminated in some implementations.

Figure 7:
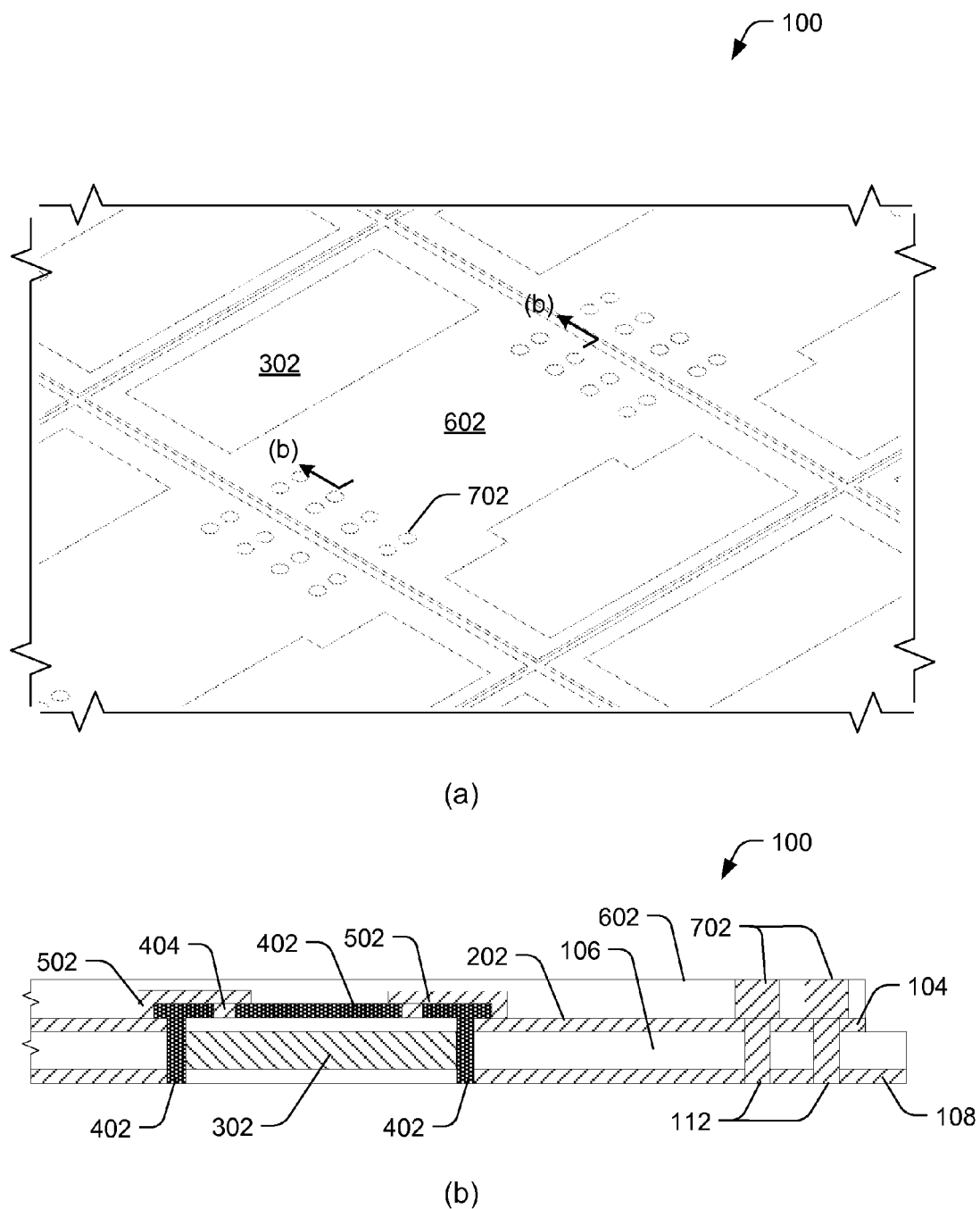
FIG. 7 illustrates an example laminate substrate having contact plating, according to an implementation. A top view of the substrate and a magnified cross-sectional view of the substrate are shown at (a) and (b), respectively.

FIG. 7 illustrates an example package 100 having contact plating, according to an implementation. A top view of the package 100 and a magnified cross-sectional view of the package 100 are shown in FIG. 7 at (a) and (b), respectively.

In an implementation, contacts 702 are formed on the laminate substrate 102, during a contact plating process. In the implementation, at least a portion of the contacts 702 are electrically coupled to terminals on a front side and/or a backside of one or more die 302. For example, the contacts 702 may be coupled to one or more through vias 112, as shown in FIG. 7. In the example, the through vias 112 may be coupled to one or more terminals of the die 302, through the first (104) and/or second (108) conductive layers.

Various implementations advantageously use an electroless plating technology to simultaneously process both sides of the laminate substrate 102. During electro-less plating, the laminate substrate 102, including the die 302, is immersed in a plating bath. Thus, both sides are exposed to the plating bath and therefore processed at once. In one or more implementations, the through vias 112 may also be filled at the same time during the electro-less deposition process. Alternately, an electro-plating process may be used to process one or both sides of the laminate substrate 102.

In various implementations, the package 100 comprising the laminate substrate 102 may be singulated to form individual semiconductor packages 100. The semiconductor package 100 thus formed may be individually applied, or may be integrated into a multi-layer printed circuit board (PCB) stack in various configurations. The semiconductor package 100 may be used as a full circuit stage, for example, as a "daughterboard" or "piggy-back board," which is an extension circuit board or "daughter" of a motherboard or a card.

Figure 8:
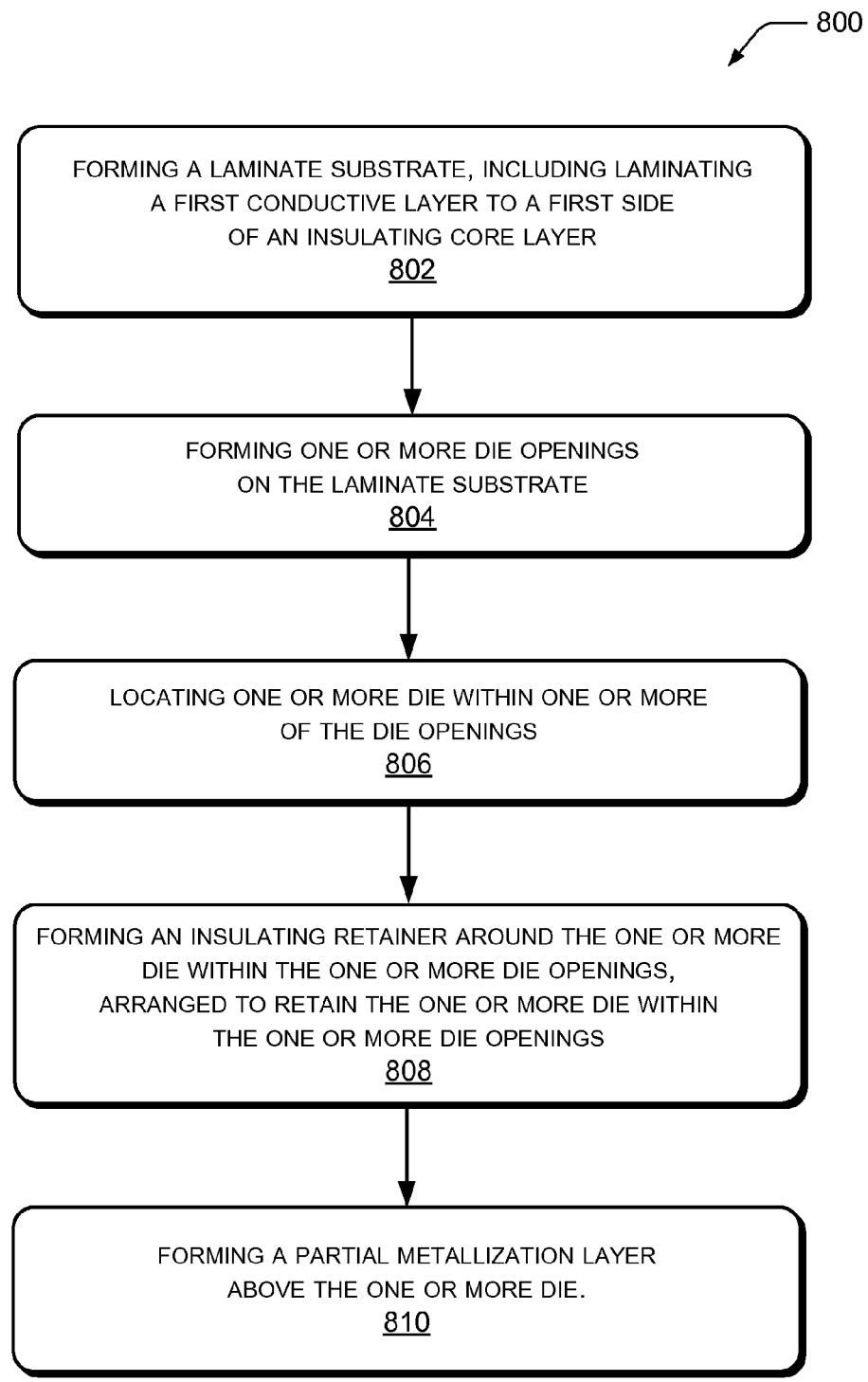
FIG. 8 illustrates an example flow diagram representing a method or process for packaging one or more die, according to an implementation.

Implementations of packages 100 described herein advantageously use sequential build up technologies and process (e.g., method) steps. This reduces waste products during the wafer level packaging. For example, metallization layers are deposited only where directed. Materials do not need to be removed or machined with expensive and difficult processing technologies. Further, in various implementations, many of the processes are completed as double sided operations. For example, plating, photo-resist developing, etching, and solder mask developing may be carried out together to reduce process steps. FIG. 8 illustrates an example process 800 as disclosed herein. However, the process steps described need not be completed in the order given herein. Further, various process steps may be combined or otherwise modified (e.g., some steps may be deleted or altered) and remain within the scope of the disclosure.

Implementations use photo-imaging dielectrics, which result in a process that allows large flexibility in the shape, area, and mix of aperture size and form. This photo-imaging process produces a very thin, (e.g., about 6 μm to about 40 μm) dielectric layer. The photo-imaging process creates virtually no surface topology, therefore it is possible to open a very small connection as well as very large ones. So, for example, a small aperture 110 may be placed next to a very large aperture 110. For example, a 25 μm round aperture 110 may be produced next to a square aperture 110 of 100 mm$^2$. The subsequent plating technology is also very simple because of the flat topology and therefore complexities of blind-via plating are avoided.

Advantageously, in various implementations, the die 302 remain visible through much of the early processing. Therefore, complicated procedures relating to finding the die 302 or blind processing are avoided using various implementations.

While the devices and techniques have been described with reference to illustrative implementations, this description is not intended to be construed in a limiting sense. Various modifications and combinations of the illustrative implementations, as well as other implementations will be apparent to persons skilled in the art upon reference to the description.

Although the devices and techniques and their advantages have been described in detail, it should be understood that various changes, substitutions and alterations can be made herein without departing from the spirit and scope of the disclosure. For example, it will be readily understood by those skilled in the art that many of the features, functions, processes, and materials described herein may be varied while remaining within the scope of the present disclosure.

Moreover, the scope of the present application is not intended to be limited to the particular implementations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding implementations described herein may be utilized.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method, comprising:
    forming a laminate substrate, including laminating a first conductive layer to a first side of an insulating core layer;
    forming one or more die openings on the laminate substrate;
    locating one or more die within one or more of the die openings;
    forming an insulating retainer around the one or more die within the one or more die openings, arranged to retain the one or more die within the one or more die openings;
    forming a partial metallization layer above the one or more die; and
    forming conductive traces that include a mix of coarse geometry and fine geometry by removing a portion of the first conductive layer to form a first plurality of conductive traces that include the coarse geometry and forming a second plurality of conductive traces that include the fine geometry via the partial metallization layer to couple the one or more die to the first plurality of conductive traces.

2. The method of claim 1, further comprising laminating a second conductive layer to a second, opposite side of the insulating core layer.

3. The method of claim 2, further comprising electrically coupling at least a portion of the second conductive layer to a node at the first side of the insulating core layer using one or more through vias.

4. The method of claim 1, further comprising forming contacts on the laminate substrate, at least a portion of the contacts electrically coupled to terminals on at least one of a front side and a backside of the one or more die.

5. The method of claim 1, further comprising forming the insulating retainer in a space between an inner edge of the one or more die openings and an outer edge of the one or more die located within the one or more die openings.

6. The method of claim 1, wherein forming the insulating retainer comprises:
    using a printing process, depositing an insulating material in a first region around a perimeter of each die of the one or more die; and
    using a photo-imaging process, removing a portion of the insulating material from the first region to form the insulating retainer.

7. The method of claim 1, further comprising at least one of separating and retaining a plurality of die within a single die opening with the insulating retainer.

8. The method of claim 1, further comprising coating an entire top surface of a die with insulating material, excluding one or more apertures to provide access to terminals of the die.

9. The method of claim 1, further comprising coating the entire lower surface of the die with an insulating material.

10. The method of claim 9, further comprising forming an opening in the insulating material for connection to a terminal of the die.

11. The method of claim 1, further comprising metalizing above the one or more die and a portion of the laminate substrate surrounding the one or more die to electrically couple the one or more die to the first conductive layer.

12. The method of claim 1, further comprising singulating the laminate substrate to form individual packages.

13. A method of fabricating a semiconductor package, comprising:
- forming one or more die openings on a copper-clad laminate substrate, the laminate substrate including a first copper layer laminated to a first side of an insulating core and a second copper layer laminated to a second side of the insulating core;
- forming one or more through vias on the laminate substrate, arranged to electrically couple at least a portion of the second copper layer to one or more nodes at the first copper layer;
- removing a portion of the first copper layer to form a plurality of coarse traces;
- locating a plurality of semiconductor chip die within one or more of the die openings;
- forming an insulating retainer around each die of the plurality of semiconductor chip die within the one or more die openings, the retainer arranged to retain and separate the plurality of semiconductor chip die within the one or more die openings;
- at least partially coating the plurality of semiconductor chip die with an insulating layer;
- forming a plurality of fine traces via a partial metallization on the insulating layer above the plurality of semiconductor chip die, the fine traces electrically coupled to the plurality of semiconductor chip die and to the plurality of coarse traces; and
- forming a plurality of contacts via plating, the contacts electrically coupled to the coarse traces.

14. The method of claim 13, further comprising removing a portion of the insulating layer from the plurality of semiconductor chip die for terminal connections via the fine traces.

15. The method of claim 13, further comprising plating the through vias to electrically couple at least the portion of the second copper layer to the one or more nodes at the first copper layer.

16. The method of claim 13, further comprising forming a solder mask covering one or more portions of the semiconductor package.

17. The method of claim 13, wherein a ratio of a width of the fine traces to a width of the coarse traces is about 15:1 to about 30:1.

* * * * *